(12) United States Patent
Ahlstedt et al.

(10) Patent No.: US 8,772,804 B2
(45) Date of Patent: Jul. 8, 2014

(54) SEMICONDUCTOR LIGHT-EMITTING DIODE AND METHOD FOR PRODUCING A SEMICONDUCTOR LIGHT-EMITTING DIODE

(75) Inventors: Magnus Ahlstedt, Regensburg (DE); Johannes Baur, Regensburg (DE); Ulrich Zehnder, Rettenbach (DE); Martin Strassburg, Tegernheim (DE); Matthias Sabathil, Regensburg (DE); Berthold Hahn, Hemau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 310 days.

(21) Appl. No.: 12/920,311

(22) PCT Filed: Feb. 11, 2009

(86) PCT No.: PCT/DE2009/000192
§ 371 (c)(1),
(2), (4) Date: Nov. 24, 2010

(87) PCT Pub. No.: WO2009/106038
PCT Pub. Date: Sep. 3, 2009

(65) Prior Publication Data
US 2011/0198640 A1    Aug. 18, 2011

(30) Foreign Application Priority Data
Feb. 29, 2008 (DE) .......... 10 2008 011 847
Jun. 6, 2008 (DE) .......... 10 2008 027 045

(51) Int. Cl.
*H01L 33/00* (2010.01)
*H01L 33/40* (2010.01)
*H01L 33/42* (2010.01)
*H01L 33/46* (2010.01)

(52) U.S. Cl.
CPC .............. *H01L 33/405* (2013.01); *H01L 33/42* (2013.01); *H01L 33/46* (2013.01)
USPC .......... 257/98; 257/E33.072; 257/79; 257/13; 438/29

(58) Field of Classification Search
CPC ........................................ H01L 33/00
USPC ................. 257/13, 79, 98, E33.072; 438/29
See application file for complete search history.

(56) References Cited

U.S. PATENT DOCUMENTS 6,849,165 B2 * 2/2005 Kloppel et al. .......... 204/192.15
8,158,995 B2 * 4/2012 Ploessl et al. .................. 257/98
(Continued)

FOREIGN PATENT DOCUMENTS

CN   1613156   5/2005
CN   1897318   1/2007
(Continued)

OTHER PUBLICATIONS

Betz et al., ":On the synthesis of ultra smooth ITO thin films by conventional direct current magnetron sputtering", Thin Solid Films, Elsevier Sequoia S.A., Lausanne, Switzerland, vol. 516, No. 7, Jan. 29, 2008, pp. 1334-1340.

(Continued)

*Primary Examiner* — Telly Green
(74) *Attorney, Agent, or Firm* — Cozen O'Connor

(57) ABSTRACT

A semiconductor light-emitting diode (10) is proposed having at least one p-doped light-emitting diode layer (4), an n-doped light-emitting diode layer (2) and an optically active zone (3) between the p-doped light-emitting diode layer (4) and the n-doped light-emitting diode layer (2), having an oxide layer (8) consisting of a transparent conductive oxide, and having at least one mirror layer (9), wherein the oxide layer (8) is disposed between the light-emitting diode layers (2, 4) and the at least one mirror layer (9), and comprises a first boundary surface (8a) which faces the light-emitting diode layers (2, 4) and a second boundary surface (8b) which faces the at least one mirror layer (9), and wherein the second boundary surface (8b) of the oxide layer (8) has less roughness (R2) than the first boundary surface (8a) of the oxide layer (8).

15 Claims, 3 Drawing Sheets

(56) References Cited

U.S. PATENT DOCUMENTS

| | | |
|---|---|---|
| 2003/0111667 A1 | 6/2003 | Schubert |
| 2003/0141506 A1 | 7/2003 | Sano et al. |
| 2003/0166308 A1 | 9/2003 | Nakamura et al. |
| 2003/0170449 A1 | 9/2003 | Kloppel et al. |
| 2005/0121685 A1 | 6/2005 | Seong et al. |
| 2005/0236630 A1 | 10/2005 | Wang |
| 2006/0011923 A1 | 1/2006 | Eisert et al. |
| 2006/0170335 A1 | 8/2006 | Cho et al. |
| 2006/0249736 A1 * | 11/2006 | Lee et al. .................. 257/79 |
| 2007/0020788 A1 | 1/2007 | Liu et al. |
| 2007/0029561 A1 | 2/2007 | Cho et al. |
| 2008/0173863 A1 | 7/2008 | Hahn et al. |
| 2009/0090900 A1 | 4/2009 | Avramescu et al. |
| 2009/0104733 A1 * | 4/2009 | Chae et al. .................. 438/97 |
| 2009/0283783 A1 * | 11/2009 | Streubel .................. 257/98 |
| 2010/0208763 A1 * | 8/2010 | Engl et al. .................. 372/46.01 |
| 2010/0264434 A1 * | 10/2010 | Ploessl et al. .................. 257/98 |

FOREIGN PATENT DOCUMENTS

| | | | |
|---|---|---|---|
| DE | 102005013894 | | 1/2006 |
| DE | 102004050891 | | 4/2006 |
| DE | 10 2005 035 722 | | 2/2007 |
| DE | 102006023685 | | 4/2007 |
| DE | 10 2007 002 416 | | 10/2007 |
| DK | WO/2008/135013 | * | 11/2008 |
| EP | 1995794 | | 11/2008 |
| JP | 2001009583 A | * | 1/2001 ............ B23K 26/06 |
| JP | 2003-532997 | | 11/2003 |
| JP | 2006-313888 | | 11/2006 |
| JP | 2007273975 A | * | 10/2007 |
| TW | I338379 | | 3/2011 |
| WO | WO 01/86731 | | 11/2001 |
| WO | WO 2007/105626 | | 9/2007 |
| WO | WO 2007105626 A1 | * | 9/2007 |
| WO | WO 2009/015645 | | 2/2009 |

OTHER PUBLICATIONS

Kim, Jong Kyu et al., "Enhanced light-extraction in GaInN near-ultraviolet light emitting diode with Al-based omnidirectional reflector having NiZn/Ag microcontacts", Applied Physics Letters 89, 141123, 2006 (1 page).

Kim, Jong Kyu et al., "GaInN light-emitting diodes with Ru2 Si2 Ag omni-directional reflector", Applied Physics Letters, vol. 84, No. 22, May 31, 2004 (1 page).

Office Action dated Feb. 22, 2013 issued in the corresponding Chinese Patent Application No. 200980107062.X.

* cited by examiner

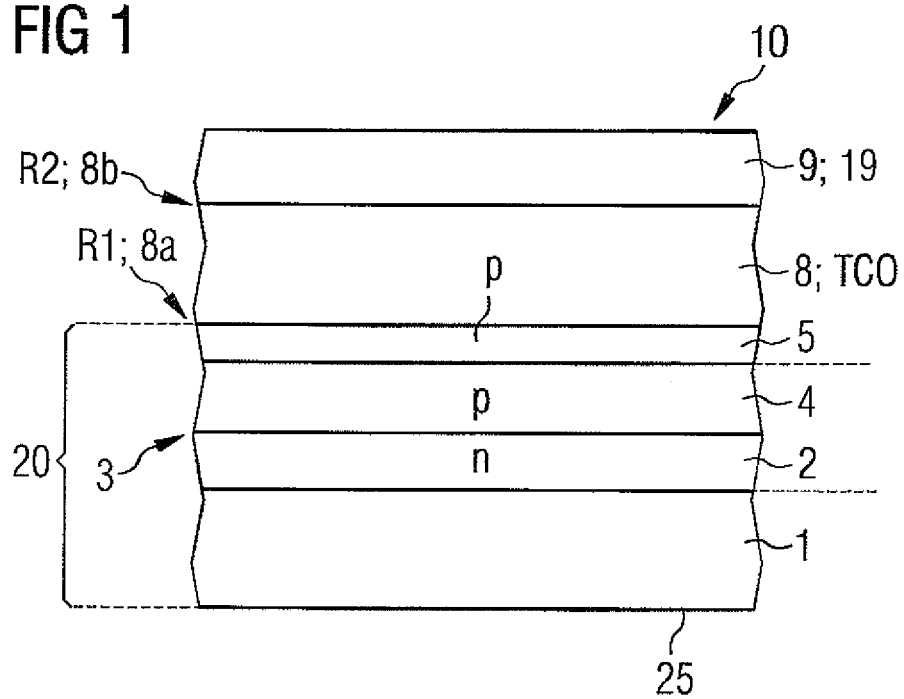
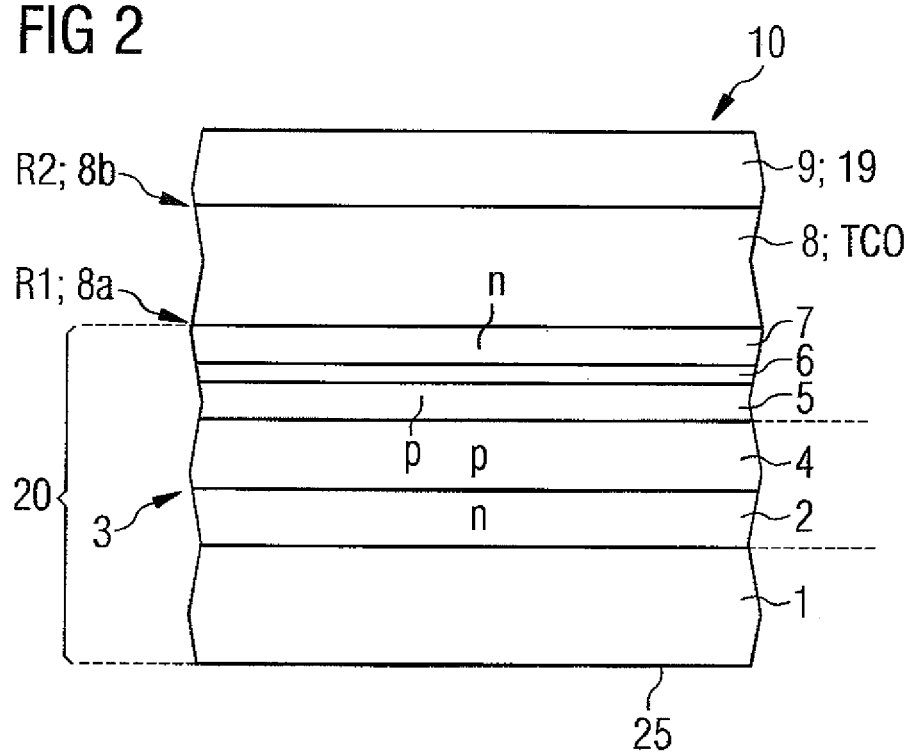

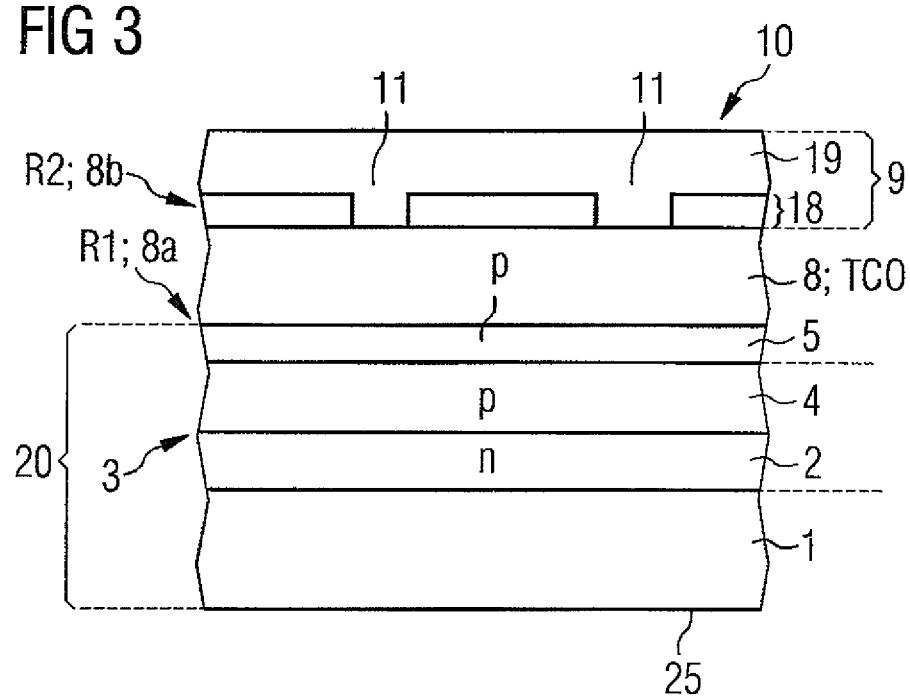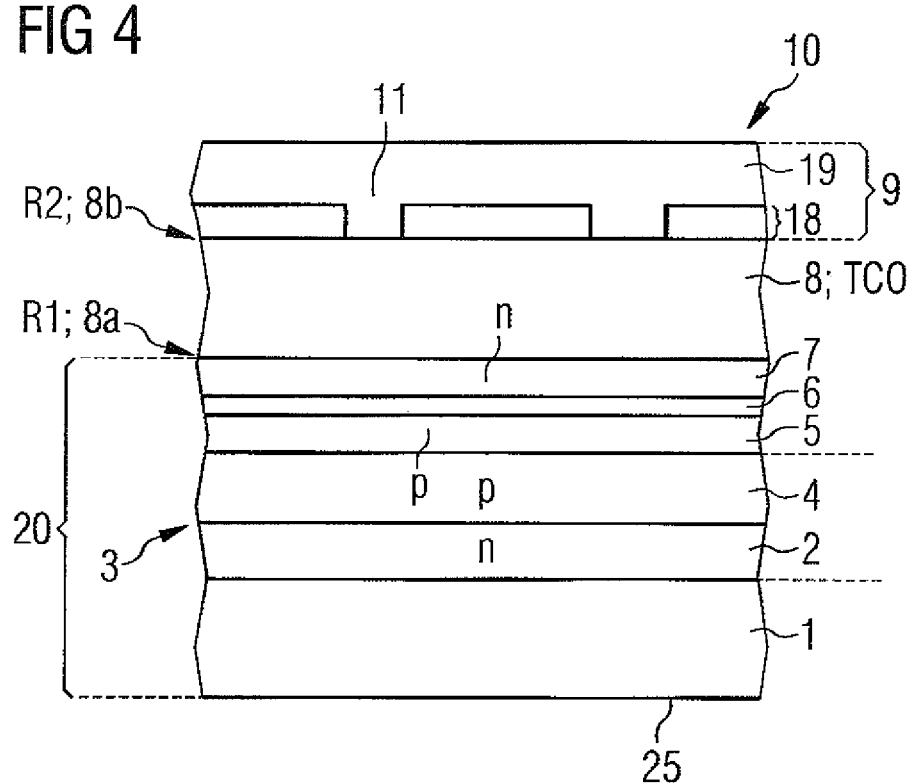

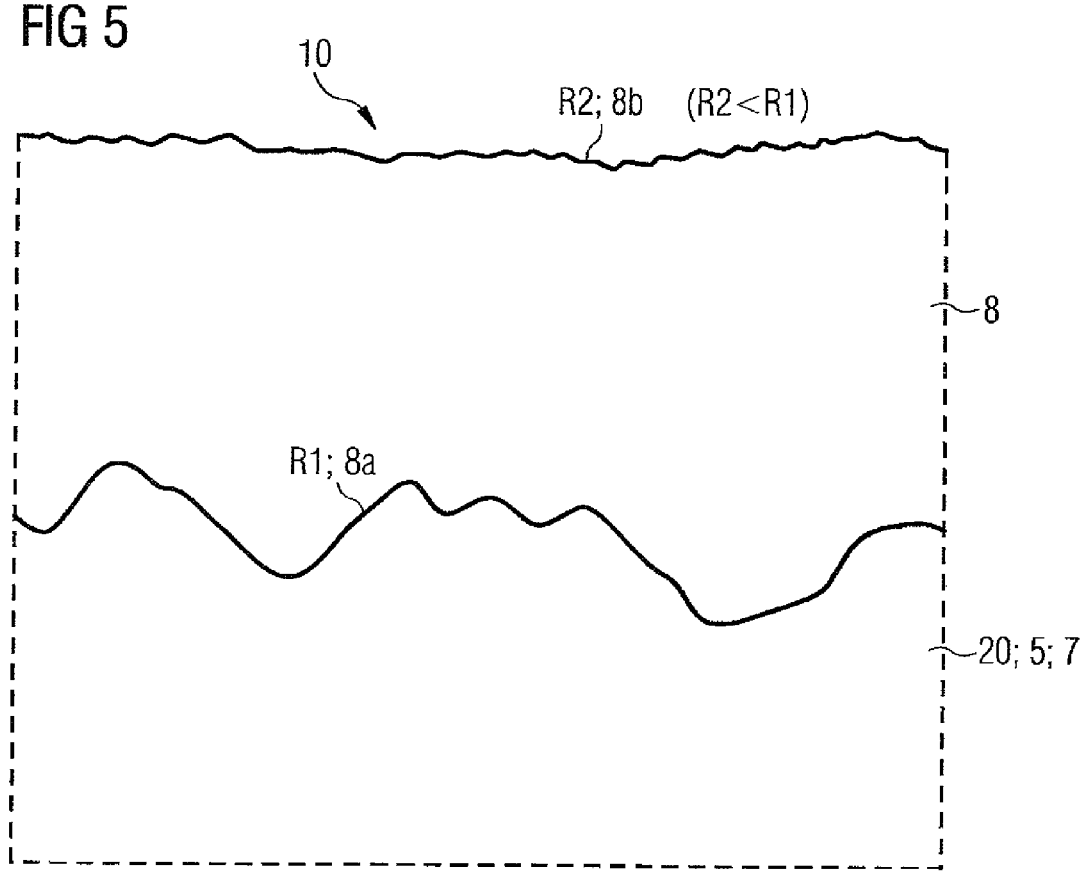

SEMICONDUCTOR LIGHT-EMITTING DIODE AND METHOD FOR PRODUCING A SEMICONDUCTOR LIGHT-EMITTING DIODE

RELATED APPLICATIONS

This is a U.S. national stage of application No. PCT/DE2009/000192, filed on Feb. 11, 2009, and claims priority on German patent application No. 10 2008 011 847.8, filed on Feb. 28, 2008, and German patent application No. 10 2008 027 045.8, filed on Jun. 6, 2008, the disclosure contents of both of which are hereby incorporated by reference.

FIELD OF THE INVENTION

The invention relates to a semiconductor light-emitting diode and a method for producing a semiconductor light-emitting diode.

BACKGROUND OF THE INVENTION

Semiconductor light-emitting diodes have a layer stack consisting of semiconductor layers whose materials are specifically selected (with respect to base material and dopant) and are adapted to each other in order to set to a predetermined extent the optoelectronic properties and the electronic band structure within the individual layers and at the layer boundaries. At the transition between two adjacent, mutually complementarily doped light-emitting diode layers (p-doped and n-doped), an optically active zone is created which emits electromagnetic radiation when current flows through the semiconductor layer stack. The generated radiation is initially emitted in all directions, i.e., only partly in the emission direction of the semiconductor light-emitting diode. In order to reflect the proportion of the radiation emitted to the opposite side of the semiconductor layer stack back in the emission direction, an oxide layer, consisting of a transparent conductive oxide, and one or several mirror layers are provided behind the semiconductor layer stack. One portion of the electromagnetic radiation impinging upon the mirror layers is reflected depending upon the difference in the optical refractive indices of the layers, upon the conductivity of the mirror layer, upon the transparency of the oxide layer as well as upon the thickness of the oxide layer and of the preceding layers towards the optically active zone. In order to increase the reflected portion, conventionally in addition to the layer thicknesses primarily the material properties and material compositions of the respective layers are modified and optimised.

SUMMARY OF THE INVENTION

If the portion of electromagnetic radiation which impinges upon the mirror layer and is reflected back by the mirror layer could be increased, then the luminous efficiency of semiconductor light-emitting diodes could be increased.

A semiconductor light-emitting diode is provided having at least one p-doped light-emitting diode layer, an n-doped light-emitting diode layer and an optically active zone between the p-doped light-emitting diode layer and the n-doped light-emitting diode layer, having an oxide layer of a transparent conductive oxide, and having at least one mirror layer, wherein the oxide layer is disposed between the light-emitting diode layers and the at least one mirror layer, and comprises a first boundary surface which faces the light-emitting diode layers and a second boundary surface which faces the at least one mirror layer, and wherein the second boundary surface of the oxide layer has less roughness than the first boundary surface of the oxide layer.

Furthermore, a semiconductor light-emitting diode is provided in which the second boundary surface of the oxide layer has a roughness less than 1.0 nm.

Forming the mirror layer on the second boundary surface of reduced roughness ensures that the degree of reflection at the boundary surface between the oxide layer and the mirror layer is increased, wherein primarily the portions of radiation impinging at large angles of incidence are reflected to a greater extent.

If the oxide layer is provided with a layer thickness of more than 5 nm, then it is ensured that irregularities in the first boundary surface of the oxide layer, which irregularities are caused by the roughness of the underlying uppermost semiconductor layer, are evened out and thus the roughness of the second boundary surface of the oxide layer is not adversely influenced thereby.

If the p-doped light-emitting diode layer is disposed closer to the oxide layer than the n-doped light-emitting diode layer, then the oxide layer and the mirror layer are located on the p-side of the semiconductor light-emitting diode. Although connecting the oxide layer on that side involves increasing the operating voltage of the semiconductor light-emitting diode, this can be compensated for as will be described hereinafter.

According to one development, a p-doped semiconductor layer is disposed between the p-doped light-emitting diode layer and the oxide layer which p-doped semiconductor layer has a dopant concentration which is at least as large as the dopant concentration of the p-doped light-emitting diode layer. The p-doped semiconductor layer protects the p-doped light-emitting diode layer from crystal lattice damage when depositing the oxide layer.

According to a first embodiment, the first boundary surface of the oxide layer adjoins the p-doped semiconductor layer.

According to an alternative second embodiment, provision is made that an n-doped semiconductor layer is disposed between the p-doped semiconductor layer and the oxide layer, and that the oxide layer adjoins the n-doped semiconductor layer. As a result, a low-impedance connection of the oxide layer to the semiconductor layer stack is achieved.

According to one development, a non-doped semiconductor layer is provided between the p-doped semiconductor layer and the n-doped semiconductor layer. Together with the two doped semiconductor layers, this non-doped semiconductor layer forms a tunnel contact, wherein the contact resistance of the tunnel contact is more than compensated for by the low-impedance connection of the oxide layer via the n-doped semiconductor layer and the required operating voltage is thus reduced on the whole.

The oxide layer is preferably electrically conductive.

Suitable materials for the oxide layer are, for example, zinc oxide, indium tin oxide or indium zinc oxide.

Provided the mirror layer directly adjoins the second boundary surface of the oxide layer, the second boundary surface of the oxide layer simultaneously forms a mirror surface with a particularly low roughness.

According to one embodiment, the mirror layer includes at least one metallic mirror layer.

Suitable materials for the metallic mirror layer are, in particular, gold, silver or aluminium, wherein gold is suitable for reflection in the infrared range, silver is suitable for reflection in the visible wavelength range and aluminium is suitable for reflection in the UV range.

According to one further embodiment—as an alternative to the metallic mirror layer or in addition thereto—at least one dielectric mirror layer is provided. In particular in combination with the metallic mirror layer, the dielectric mirror layer increases the reflection coefficient of the reflector on the rear side of the semiconductor light-emitting diode.

Suitable materials for the dielectric mirror layer are, for example, glass, silicon oxide, silicon nitride or silicon oxynitride.

According to one development, provision is made that the dielectric mirror layer is disposed between the oxide layer and the metallic mirror layer and comprises local recesses in which the metallic mirror layer extends as far as to the second boundary surface of the oxide layer. As a result, the metallic mirror layer forms contacts to the transparent conductive oxide layer, on the basis of which lateral current spreading occurs in the oxide layer over the entire surface area of the semiconductor layer stack.

The base material suitable for the light-emitting diode layers can be, for example, binary, ternary or quaternary III-V semiconductor materials, in particular those which contain at least one of the elements aluminium, gallium and indium and at least one of the elements nitrogen, phosphorus and arsenic. Examples thereof are aluminium nitride, aluminium indium nitride, gallium nitride, aluminium gallium nitride, indium gallium nitride and indium gallium arsenide phosphide.

The method for producing the semiconductor light-emitting diode includes
   forming at least one p-doped light-emitting diode layer and an n-doped light-emitting diode layer,
   depositing a transparent conductive oxide, whereby an oxide layer is formed which comprises a first boundary surface which faces the light-emitting diode layers, wherein the oxide layer is deposited by means of HF-assisted DC sputtering and in doing so a second boundary surface of the oxide layer opposing the first boundary surface is produced and has less roughness than the first boundary surface of the oxide layer, and
   forming at least one mirror layer above the second boundary surface of the oxide layer.

By virtue of the fact that the oxide layer consisting of the transparent conductive oxide is deposited by means of HF-assisted DC sputtering, its second boundary surface has less roughness than its first boundary surface, and in particular the roughness of the second boundary surface is less than 1.0 nm. In the finished semiconductor light-emitting diode, this results in a greater reflection or mirror effect at the boundary surface between the oxide layer and the mirror layer.

If the oxide layer is deposited having a layer thickness of at least 5 nm, then as a result irregularities in the first boundary surface of the oxide layer, which irregularities are caused by the roughness of the underlying uppermost semiconductor layer, are evened out and the roughness of the second boundary surface of the oxide layer cannot be adversely influenced thereby.

According to one development, a p-doped semiconductor layer is deposited onto the p-doped light-emitting diode layer and has a dopant concentration which is at least as large as the dopant concentration of the p-doped light-emitting diode layer. The p-doped semiconductor layer protects the p-doped light-emitting diode layer from crystal lattice damage when sputtering-on the oxide layer.

If a non-doped semiconductor layer and an n-doped semiconductor layer are furthermore deposited over the p-doped semiconductor layer and the oxide layer is sputtered onto the n-doped semiconductor layer, then a low-impedance connection of the oxide layer is created via the n-doped semiconductor layer; the p-doped, non-doped and n-doped semiconductor layers thereby form a tunnel contact whose contact resistance is more than compensated for by the low-impedance connection of the oxide layer to the n-doped semiconductor layer.

According to one development, forming the mirror layer includes depositing at least one dielectric mirror layer, etching recesses into the dielectric mirror layer and depositing at least one metallic mirror layer onto the dielectric mirror layer; as a result the metallic mirror layer forms contacts to the oxide layer in the recesses of the dielectric mirror layer, on the basis of which contacts lateral current spreading occurs in the oxide layer over the entire surface area of the semiconductor layer stack.

BRIEF DESCRIPTION OF THE DRAWINGS

Several exemplary embodiments of the invention will be described hereinafter with reference to the Figures, in which:
   FIG. 1 shows a first exemplary embodiment of a semiconductor light-emitting diode,
   FIG. 2 shows a second exemplary embodiment of a semiconductor light-emitting diode,
   FIG. 3 shows a third exemplary embodiment of a semiconductor light-emitting diode having several mirror layers,
   FIG. 4 shows a fourth exemplary embodiment of a semiconductor light-emitting diode having several mirror layers, and
   FIG. 5 shows an enlarged schematic detail view of a provisional semiconductor product during the production of a semiconductor light-emitting diode according to any one of FIGS. 1 to 4.

DETAILED DESCRIPTION OF THE DRAWINGS

FIG. 1 shows a cross-sectional view of a first exemplary embodiment of a semiconductor light-emitting diode 10 which comprises a semiconductor layer stack 20. Although the generated electromagnetic radiation, which is in the visible range, infrared range or UV range, is firstly emitted in all directions, it is to be emitted as completely as possible through a radiation exit surface 25 of a radiation exit layer 1 (at the bottom in FIG. 1) which is disposed on the side of the semiconductor layer stack remote from the oxide layer and the mirror layer. The radiation exit layer 1 is either a substrate layer, which remains after all layers have been grown onto the substrate and the substrate has been virtually completely etched back (thin film LED), or a semiconductor layer which has been grown onto the substrate prior to the actual light-emitting diode layers, the substrate having been completely removed at a later time.

The further layers are grown onto the radiation exit layer 1 as follows: Firstly, an n-doped light-emitting diode layer 2 and a p-doped light-emitting diode layer 4 are deposited. The mutually oppositely doped light-emitting diode layers 2, 4, form a light-emitting diode layer sequence, as can be seen in FIG. 1 by the dashed lines. An optically active zone 3 is created at the boundary surface between the two semiconductor layers 2, 4 and serves to emit electromagnetic radiation when a sufficient bias voltage of appropriate polarity is applied to the light-emitting diode layers 2, 4. The n-doped light-emitting diode layer 2 is in this case doped with silicon and the p-doped light-emitting diode layer 4 is doped with magnesium, wherein the base material of the light-emitting diode layers 2, 4 is a III/V semiconductor material in each case. The radiation exit layer 1 is used to protect and electrically insulate the lower n-doped light-emitting diode layer 2.

On the side of the light-emitting diode layer sequence on which the p-doped light-emitting diode layer 4 is disposed (i.e., at the top in FIG. 1), an oxide layer 8 consisting of a transparent conductive oxide is deposited. In particular, the oxide layer 8 contains a transparent electrically conductive oxide.

The oxide layer is used for current spreading in the lateral direction in parallel with the layer boundaries as well as for obviating undesired migration between the mirror layer and the semiconductor layer stack. FIG. 1 shows an exemplary embodiment in which the oxide layer 8 is not deposited directly onto the p-doped light-emitting diode layer 4 but rather firstly a p-doped semiconductor layer 5 is deposited (in order to protect the p-doped light-emitting diode layer 4), said p-doped semiconductor layer having a dopant concentration which is at least as large as that of the p-doped light-emitting diode layer 4.

The oxide layer 8 consisting of a transparent conductive oxide (TCO) is then deposited onto the p-doped semiconductor layer 5. In doing so the roughness of the top side of the p-doped semiconductor layer 5 provides the roughness R1 of the first boundary surface 8a of the oxide layer 8. The first boundary surface of the oxide layer is the boundary surface which faces the semiconductor layer stack (and in particular directly adjoins the uppermost, lastly deposited semiconductor layer of the layer stack).

Indium tin oxide, indium zinc oxide or zinc oxide for example are suitable as the transparent conductive oxide. In the case of zinc oxide, the conductivity can be increased by doping with aluminium or gallium. Furthermore, instead of a single oxide layer a layer sequence of several oxide layers can also be provided.

The oxide layer is deposited by means of HF-assisted DC sputtering; as a result it acquires an upper second boundary surface 8b which has a particularly low roughness R2. After the oxide layer 8 has been sputtered-on, its second boundary surface 8b is initially exposed; finally the mirror layer 9 (in particular a metallic mirror layer 19) is deposited thereon according to FIG. 1.

The boundary surfaces between the respective layers of the semiconductor layer stack and between the semiconductor layer stack, the oxide layer and the mirror layer always have a particular roughness. The roughness is mostly provided as a numerical value (for example in nm) with the addition "rms" (root mean squared—deviation from the ideal boundary surface plane, i.e., standard deviation of the variation in height of the boundary surface or surface). The average is determined over a surface region of the respective surface or boundary surface. The roughness of boundary surfaces within the layer sequence for the semiconductor light-emitting diode 10 is conventionally at best between 1.5 and 5 nm, however it can also be considerably higher and more than 20 nm. Deviations from the ideal crystal lattice, e.g., locally varying growth conditions or lattice distortions, even as a result of dopants, contribute in particular to the roughness.

When producing a semiconductor light-emitting diode, conventionally the materials and material combinations of the respective layers (including dopants) are optimised and adapted to each other. Furthermore, layer thicknesses and refractive indices of the layers are optimised in order to achieve constructive interference of the electromagnetic radiation reflected at the boundary surfaces and thus a high luminosity for the light-emitting diode. The influence of variations in height of the layer boundaries, which are caused by roughness and are smaller than the wavelength of the radiation to be reflected by two to three orders of magnitude (corresponding to a factor of 100 to 1000), is, however, mostly neglected.

The second boundary surface of the oxide layer, which is remote from the semiconductor layer stack, i.e., which faces the mirror layer, conventionally has even more roughness than the first boundary surface of the oxide layer since the transparent conductive oxide generally does not grow in a monocrystalline manner but rather grows in a polycrystalline or amorphous manner.

However, depositing the oxide layer 8 by means of an HF-assisted DC sputtering process, as proposed herein, produces particularly low roughness R2 on the second boundary surface 8b of the oxide layer and thus increases the reflectivity of the mirror layer to be deposited thereon. The HF-assisted DC sputtering process will now be discussed with reference to FIG. 5.

The mirror layer 9 is deposited onto the second boundary surface 8b (exposed after performing the sputtering process) of the oxide layer 8. The mirror layer 9 is deposited by means of PVD (Physical Vapour Deposition) or CVD (Chemical Vapour Deposition), in particular by means of PECVD (Plasma Enhanced Chemical Vapour Deposition), MBE (Molecular Beam Epitaxy), IBE (Ion Beam Etching) or by thermal evaporation. In this exemplary embodiment, the mirror layer 9 is a metallic mirror layer 19 which consists of gold, silver or aluminium or an alloy which contains at least one of these metals. The metallic mirror layer 19 can also include several layers each being made of a metal or a metal alloy.

The materials and layer thicknesses of the oxide layer 8 and the mirror layer 9 are adjusted to each other such that the portion of electromagnetic radiation emitted by the optically active zone 3 which is emitted in the direction of the oxide layer and the mirror layer is reflected as completely as possible at the second boundary surface 8b of the oxide layer 8. The angle of incidence of the radiation to be reflected is subject to a statistical distribution and can basically be any value between 0 degrees and 90 degrees relative to the surface normal of the reflecting boundary surface of the mirror layer. The low roughness of the second boundary surface 8b of the oxide layer 8 results in that even in the case of large angles of incidence relative to the surface normal of the second boundary surface 8b, overall a larger proportion of the impinging electromagnetic radiation is reflected. As a result, the intensity of the electromagnetic radiation emitted by the semiconductor light-emitting diode is increased.

FIG. 2 shows a second exemplary embodiment of a semiconductor light-emitting diode in which in addition to the layers illustrated in FIG. 1 a non-doped semiconductor layer 6 and an n-doped semiconductor layer 7 are also provided and are disposed between the p-doped semiconductor layer 5 and the oxide layer 8. The n-doped semiconductor layer 7 facilitates the connection of the oxide layer 8 consisting of the transparent conductive oxide to the semiconductor layer stack 20. The non-doped semiconductor layer 6 is disposed between the p-doped semiconductor layer 5 and the n-doped semiconductor layer 7. The sequence of the semiconductor layers 5, 6 and 7 forms a tunnel contact to the actual light-emitting diode layer sequence consisting of the light-emitting diode layers 4 and 2. A slight increase in the operating voltage through the tunnel contact is more than compensated for by the low-impedance connection of the oxide layer 8 via the n-doped semiconductor layer 7.

The same base materials used for the light-emitting diode layers 2, 4 are suitable for the layers 5, 6 and 7. In this exemplary embodiment, the layer thickness of the doped semiconductor layers 5, 7 is smaller than 30 nm; for example it is between 3 and 20 nm. Furthermore, in this exemplary embodiment, the layer thickness of the non-doped semiconductor layer 6 is smaller than 20 nm; for example it is between 1 and 10 nm. The remainder of the embodiment described for FIG. 1 is applicable for FIG. 2.

The layers, illustrated in FIGS. 1 and 2, of the semiconductor layer stack 20 are deposited for example by means of CVD (Chemical Vapour Deposition) before the oxide layer 8 is deposited onto the semiconductor layer stack 20 and the mirror layer 9 is deposited thereon. On the lower side of the semiconductor layer stack 20 the substrate is subsequently thinned or completely removed so that the radiation exit layer 1 is exposed.

Whilst FIGS. 1 and 2 show exemplary embodiments in which the oxide layer 8 directly adjoins the lower side of a metallic mirror layer 19, FIGS. 3 and 4 show exemplary embodiments having an additional dielectric mirror layer 18 between the oxide layer 8 and the metallic mirror layer 19. In FIG. 3, the semiconductor layer stack 20 has the same construction as in FIG. 1; in FIG. 4 it has the same construction as in FIG. 2. The explanations with respect to FIGS. 1 and 2 are thus also applicable for FIGS. 3 and 4 respectively.

According to FIGS. 3 and 4, the oxide layer 8 is deposited onto the uppermost semiconductor layer 5 and 7 respectively by means of HF-assisted DC sputtering. A dielectric mirror layer 18 (e.g., consisting of silicon oxide) is initially deposited onto the second boundary surface 8b of said oxide layer. Recesses 11 are then etched into the dielectric mirror layer 18 and a metallic mirror layer 19 is deposited onto the dielectric mirror layer 18. The material of the metallic mirror layer 19 extends in the recesses of the dielectric mirror layer 18 as far as to the second boundary surface 8b of the oxide layer 8 and thus forms at this location linked contacts to the oxide layer 8. On the basis of the linked contacts, lateral current spreading then occurs in the transparent conductive oxide layer 8 over the entire surface area of the semiconductor layer stack 20.

In this exemplary embodiment, the mirror layer 9 includes a dielectric mirror layer 18 and also a metallic mirror layer 19. Since the mirror layers 9; 18, 19 are deposited after the oxide layer 8, the low roughness R2 of the second boundary surface 8b of the oxide layer 8 also causes the roughness of the boundary surface between the mirror layers 18 and 19 to be reduced. As a result, the reflection coefficient of the mirror layer stack is further increased since the low roughness of the second boundary surface of the oxide layer also causes the roughness of the boundary surfaces of subsequent mirror layers to be reduced to a certain extent. The remainder of the embodiment described for FIGS. 1 and 2 is applicable for FIGS. 3 and 4.

In the case of the above-mentioned exemplary embodiments, the following dopant concentrations are provided: The n-doped light-emitting diode layer 2 has a dopant concentration of less than $1 \times 10^{20}/cm^3$, in particular less than $1 \times 10^{19}/cm^3$. The p-doped light-emitting diode layer 4 has a dopant concentration of less than $2 \times 10^{20}/cm^3$. The dopant concentration of the p-doped semiconductor layer 5 is at least as high as that of the p-doped light-emitting diode layer 4 and is more than $2 \times 10^{20}/cm^3$. The dopant concentration of the n-doped semiconductor layer 7 is higher than that of the n-doped light-emitting diode layer 2 and is more than $2 \times 10^{20}/cm^3$. Therefore, each of the two semiconductor layers 5, 7 is doped to a greater extent than the respective light-emitting diode layers 4, 2 of the same dopant type. The p-doped layers are doped with magnesium and the n-doped layers are doped with silicon.

Alternatively, the dopant concentration of the n-doped semiconductor layer 7 can also be less than the dopant concentration of the n-doped light-emitting diode layer 2.

FIG. 5 shows an enlarged schematic detail view of a provisional semiconductor product for producing the semiconductor light-emitting diode according to any one of FIGS. 1 to 4, in fact after sputtering-on the oxide layer 8. An upper partial region of the uppermost layer of the semiconductor layer stack 20 as well as the oxide layer which is sputtered thereon and is made of the transparent conductive oxide are illustrated. The uppermost semiconductor layer is either the p-doped semiconductor layer 5 from FIG. 1 or 3 or the n-doped semiconductor layer 7 from FIG. 2 or 4.

If the oxide layer 8 is deposited onto the top side of the uppermost semiconductor layer 5 or 7, then the roughness of the uppermost semiconductor layer provides the roughness R1 of the lower first boundary surface 8a of the oxide layer 8; it is typically more than 1.5 nm rms but it can also be substantially higher—depending upon the method of deposition for the uppermost semiconductor layer, its base material and its dopant concentration. In the case of a p-doped semiconductor layer 5 (FIG. 1 or 3) consisting of gallium nitride, the roughness of its top side is between 1.2 to 1.8 nm.

The HF-assisted DC sputtering method for depositing the oxide layer 8 consisting of the transparent conductive oxide ensures that the roughness R2 of its second boundary surface 8b, as illustrated in FIG. 5, is less than the roughness R1 of the first boundary surface 8a, in particular less than 1.0 nm or even 0.5 nm.

In the exemplary embodiments described here, the oxide layer 8 is sputtered-on with a layer thickness of between 1 and 50 nm, wherein a larger layer thickness can also be selected. If the oxide layer is deposited with a minimum layer thickness of e.g., 5 nm, then irregularities, which arise from the underlying semiconductor layer 5 or 7, are evened out during the sputtering-on of the oxide layer. It is thereby ensured that the roughness R2 of the second boundary surface 8b of the oxide layer 8 is influenced only by the HF-assisted DC sputtering method but not by variations in height of the deeper-lying semiconductor layers.

The mirror layers which are disposed on the oxide layer (deposited by means of the HF-assisted DC sputtering) have extremely smooth reflective surfaces. In addition, the uppermost semiconductor layer of the semiconductor layer stack, which layer is exposed prior to sputtering-on the oxide layer 8, is barely damaged by the HF-assisted DC sputtering method.

The HF-assisted DC sputtering method, which is known per se, is in this case used to deposit the oxide layer 8 of the transparent conductive oxide onto the uppermost layer of the semiconductor layer stack 20 for the light-emitting diode. During the HF-assisted DC sputtering method, a high-frequency alternating voltage is superimposed onto an electric direct voltage. The electric power supplied for sputtering thus includes a direct current (DC) portion and a high-frequency (HF) portion. The frequency of the high-frequency power portion is for example 13.56 MHz. During sputtering, the combined DC/HF power is supplied for example to an electrode disposed in a sputtering chamber.

The second boundary surface 8b of the oxide layer 8 deposited by means of the HF-assisted DC sputtering method, and the boundary surfaces of the further mirror layers 18, 19 deposited onto the second boundary surface 8b reflect a higher portion of the electromagnetic radiation impinging thereon owing to the reduced roughness. This is particularly applicable for the radiation portions which impinge upon these boundary surfaces at larger angles of incidence relative to the surface normal.

Owing to the increased reflection coefficient, the semiconductor light-emitting diode 10 emits overall a greater intensity of electromagnetic radiation at its radiation exit surface 25.

The description made with reference to the exemplary embodiments does not restrict the invention. Rather, the invention encompasses any novel feature and any combination of features, including in particular any combination of features in the claims, even if this feature or this combination is not itself explicitly indicated in the claims or exemplary embodiments.

The invention claimed is:

1. A semiconductor light-emitting diode comprising:
    at least one p-doped light-emitting diode layer, an n-doped light-emitting diode layer and an optically active zone between the p-doped light-emitting diode layer and the n-doped light-emitting diode layer;
    an oxide layer of a transparent conductive oxide; and
    at least one mirror layer comprising reflective material including at least one dielectric mirror layer;
    wherein the oxide layer is disposed between the light-emitting diode layers and the at least one mirror layer, and comprises a first boundary surface facing the light-emitting diode layers and a second boundary surface directly adjoining at least a portion of the reflective material of the at least one mirror layer, and
    wherein the second boundary surface of the oxide layer has less roughness than the first boundary surface of the oxide layer.

2. A semiconductor light-emitting diode comprising:
    at least one p-doped light-emitting diode layer, an n-doped light-emitting diode layer and an optically active zone between the p-doped light-emitting diode layer and the n-doped light-emitting diode layer;
    an oxide layer of a transparent conductive oxide; and
    at least one mirror layer comprising reflective material including at least one dielectric mirror layer;
    wherein the oxide layer is disposed between the light-emitting diode layers and the at least one mirror layer, and comprises a first boundary surface facing the light-emitting diode layers and a second boundary surface directly adjoining at least a portion of the reflective material of the at least one mirror layer, and
    wherein the second boundary surface of the oxide layer has a roughness which is less than 1.0 nm.

3. The semiconductor light-emitting diode according to claim 1 or 2, wherein the oxide layer has a layer thickness greater than 5 nm.

4. The semiconductor light-emitting diode according to claim 1 or 2, wherein the p-doped light-emitting diode layer is disposed closer to the oxide layer than the n-doped light-emitting diode layer.

5. The semiconductor light-emitting diode according to claim 1 or 2, wherein disposed between the p-doped light-emitting diode layer and the oxide layer is a p-doped semiconductor layer which has a dopant concentration which is at least as large as the dopant concentration of the p-doped light-emitting diode layer.

6. The semiconductor light-emitting diode according to claim 5, wherein the first boundary surface of the oxide layer adjoins the p-doped semiconductor layer.

7. The semiconductor light-emitting diode according to claim 5, wherein an n-doped semiconductor layer is disposed between the p-doped semiconductor layer and the oxide layer, and in that the first boundary surface of the oxide layer adjoins the n-doped semiconductor layer.

8. The semiconductor light-emitting diode according to claim 7, wherein a non-doped semiconductor layer is disposed between the p-doped semiconductor layer and the n-doped semiconductor layer.

9. The semiconductor light-emitting diode according to claim 1 or 2, wherein the transparent conductive oxide of the oxide layer contains at least one of the materials zinc oxide, indium tin oxide and indium zinc oxide.

10. The semiconductor light-emitting diode according to claim 1 or 2, wherein the reflective material comprises at least one metallic mirror layer.

11. The semiconductor light-emitting diode according to claim 10, wherein the dielectric mirror layer is disposed between the oxide layer and the metallic mirror layer and comprises local recesses in which the metallic mirror layer extends as far as to the second boundary surface of the oxide layer.

12. A method for producing a semiconductor light-emitting diode, wherein the method comprises the steps of:
    forming at least one p-doped light-emitting diode layer and an n-doped light-emitting diode layer;
    depositing a transparent conductive oxide, wherein an oxide layer is formed which comprises a first boundary surface facing the light-emitting diode layers, wherein the oxide layer is deposited by means of HF-assisted DC sputtering and in doing so producing a second boundary surface of the oxide layer opposing the first boundary surface having less roughness than the first boundary surface of the oxide layer; and
    forming at least one mirror layer including at least one dielectric mirror layer on the second boundary surface of the oxide layer.

13. The method according to claim 12, wherein forming the at least one mirror layer includes depositing the at least one dielectric mirror layer on the second boundary surface, etching recesses into the at least one dielectric mirror layer and depositing at least one metallic mirror layer onto the at least one dielectric mirror layer.

14. The semiconductor light-emitting diode according to claim 11, wherein the secondary boundary surface directly adjoins at least a portion of the dielectric mirror layer and a portion of the metallic layer in the local recesses of the dielectric mirror layer.

15. The semiconductor light-emitting diode according to claim 1 or 2, wherein the secondary boundary surface directly adjoins at least a portion of the dielectric mirror layer.

* * * * *